United States Patent [19]

Minner

[11] 3,716,801

[45] Feb. 13, 1973

[54] AMPLIFIER WITH IMPROVED AVC CIRCUIT

[75] Inventor: Willy Minner, Schwaigern, Germany

[73] Assignee: Licentia Patent-Verwaltungs-G.m.b.H., Frankfurt, Germany

[22] Filed: July 7, 1970

[21] Appl. No.: 52,814

[30] Foreign Application Priority Data

July 7, 1969 Germany....................P 19 34 306.7

[52] U.S. Cl.....................................330/29, 330/141

[51] Int. Cl................................................H03g 3/30

[58] Field of Search ..................330/29, 141; 325/410

[56] References Cited

UNITED STATES PATENTS 2,799,737 7/1957 Rich ................................330/141 X 2,858,424 10/1958 Stern et al. .........................330/29 X 3,449,684 6/1969 Kagan...............................330/141 X 2,692,306 10/1954 Hathaway et al. ................330/141 X

*Primary Examiner*—Roy Lake

*Assistant Examiner*—James B. Mullins

*Attorney*—Spencer & Kaye

[57] ABSTRACT

An improved AVC circuit for an alternating voltage amplifier which prevents over-control, and thus temporary blocking of the amplifier circuit, upon the occurrence of a sudden large increase in the amplitude of the input signal to the amplifier. The control voltage generating arrangement of the AVC circuit is constructed so that the time constant of the control voltage is increased proportionately to the increase of the output voltage from the amplifier when ever the output voltage exceeds a predetermined value.

2 Claims, 2 Drawing Figures

Inventor:
Willy Minner
BY Spencer & Kaye
ATTORNEYS.

AMPLIFIER WITH IMPROVED AVC CIRCUIT

BACKGROUND OF THE INVENTION

The present invention relates to alternating voltage amplifiers provided with automatic volume control (AVC) circuits. More particularly, this invention relates to an alternating voltage amplifier having an improved automatic volume control circuit whereby temporary blocking of the amplifier due to overcontrol as a result of a sudden increase or jump in the alternating voltage input signal to the amplifier is avoided.

In alternating voltage amplifiers with automatic volume or gain control (AVC) it often occurs that due to a sudden jump or increase in the amplitude of the alternating voltage input signal to the amplifier, the amplifier is temporarily completely blocked, i.e., no output signal can be provided. This may occur, for example, when recording audio signals and particularly voice signals with tape recorders which are provided with an automatic gain control to prevent overloading of the tape.

The cause for the temporary blockage of the amplifier is that the member of the amplifier which is controlled by the AVC voltage (i.e., the controlled amplifier stage) has a time constant $t_1$, due to its capacitances and resistances, which is not negligibly small when compared with the time constant $t_2$ of the control voltage generator in the AVC circuit, so that the controlled member or stage of the amplifier can not follow the above-mentioned jump or increase in the input signal fast enough. This inability of the controlled member or stage of the amplifier to respond quickly enough results in blocking of the amplifier in the following manner:

With a sudden jump in the alternating input voltage signal the amplifier furnishes a correspondingly high alternating output voltage signal, which output signal is fed to the control voltage generator of the AVC circuit which provides an AVC control voltage proportional to the amplifier output signal, and with a time constant $t_2$, which is applied to the controlled member of the amplifier. Because of its time constant $t_1$, the amplifier causes the amplitude of the alternating output voltage signal to follow the control voltage only after a delay, so that a control voltage is produced which is higher than that required to compensate for the instantaneous alternating input voltage signal. Due to the large amplitude of the control voltage, the amplification of the amplifier is correspondingly reduced so that the amplifier may become blocked. This blocking of the amplifier remains until the control voltage has returned to its nominal value. The time required for this process is determined by the discharge time constant of the capacitor in the AVC circuit which provides the control voltage.

SUMMARY OF THE INVENTION

It is therefore the object of the present invention to provide an improved AVC circuit which prevents the occurrence of above-mentioned blocking of the amplifier upon sudden jumps in the alternating input voltage signal to the amplifier without noticeably increasing the control time of the amplifier.

The above object is accomplished according to the present invention in that the control voltage generator utilized in the AVC circuit has a time constant which automatically increases with increasing alternating input voltage to such an extent that, independent of the value of the alternating input voltage, no over-control takes place and the above-mentioned blocking of the amplifier is thus avoided. In this way the generation of the control voltage information is slowed down until the AVC control circuit has been stabilized.

With the optimum solution of this problem the time constant $t_2$ of the control voltage generator must automatically increase starting from a predetermined alternating amplifier output voltage in proportion with this alternating output voltage.

The required automatic increase in the time constant of the control voltage generator is accomplished most easily according to the invention by limiting the charging current for the capacitor furnishing the control information. In order to achieve this result according to a preferred embodiment of the invention, the control voltage generator of the AVC circuit comprises a transistor connected as a collector detector circuit with the above-mentioned charging capacitor connected in series with its emitter current path and an ohmic resistor connected in its collector current path to limit the charging current to the capacitor.

DESCRIPTION OF THE PREFERRED EMBODIMENTS

Figure 1:
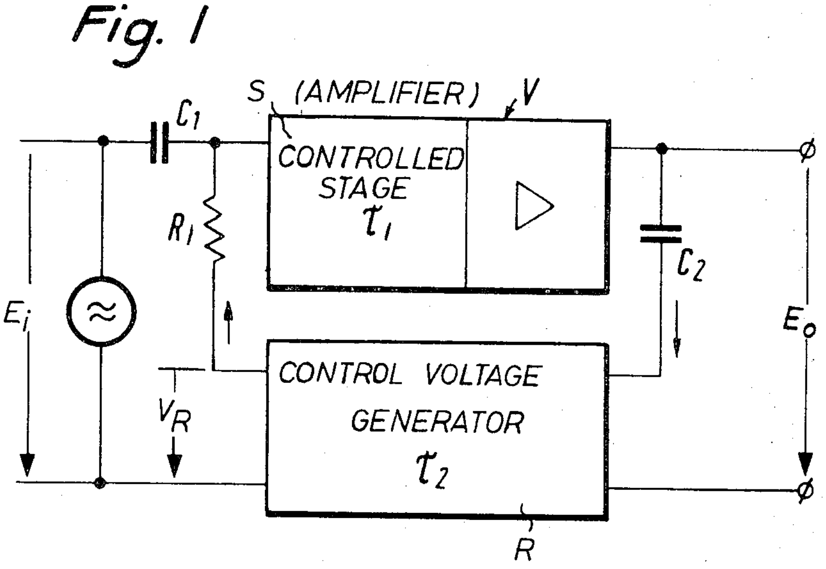
FIG. 1 is a block diagram illustrating a conventional amplifier with an AVC circuit.

Referring now to FIG. 1, there is shown an amplifier V with settable member or controllable stage S whose time constant $t_1$ is formed by internal RC elements and/or by the coupling capacitor $C_1$ and resistor $R_1$ for the supply of the AVC control voltage. The amplification of the amplifier is a function of the control voltage $V_R$ which is derived in the control voltage generator R having a time constant $t_2$ from the alternating output voltage $E_o$ of the amplifier. This alternating output voltage signal $E_o$ is fed to the input of the AVC control voltage generator R via a capacitor $C_2$. The slope of the control curve, i.e., the ratio of the amplification difference ΔV (with $V = E_o / E_i$) to the control voltage difference $\Delta V_R$ is selected to be high enough that only a slight change in the control voltage is required to accomplish the desired control function in the amplifier.

The known amplifiers of this construction with automatic volume control operate faultlessly only when the time constant $t_1$ of the amplifier is substantially less than the time constant $t_2$ of the AVC control voltage generating circuit R and thus may be considered negligible. With this relationship, a sudden increase of the input voltage $E_i$ to twice its value will be compensated in a time period T which depends only on the time constant $t_2$ of the control voltage generator. A sudden jump increase in the input voltage $E_i$ to 100 times its value, however, is compensated in approximately one one-hundredth T since the voltage offered to the control voltage generator R is also increased 100 times, but the control voltage $V_R$ required to change the amplification of the amplifier requires only a very slight adjustment with the large slope of the control curve.

Let it now be assumed that the setting member or controlled stage S has a time constant $t_1$ which is not negligibly small when compared with the time constant $t_2$. The time constant $t_2$ of the control voltage generator is assumed to be so selected that with low input voltages $E_i$ an increase of $E_i$ to twice its value is compensated in the above-mentioned time T under consideration of the time constant $t_1$ of the setting member S. Contrary to the conventionally known systems however, according to the present invention an increase in the input voltage $E_i$ and thus momentarily also in the output voltage $E_o$ of the amplifier (assuming linear amplification) to 100 times its value, also increases the time constant $t_2$ by 100 times so that the control of the sudden change in the input voltage $E_i$ again occurs in the time period T (not as previously in one one-hundredth T). Blocking of the amplifier is thus avoided since the effective time constant $t_2$ of the control voltage generator R is now substantially larger than the time constant $t_1$ of the setting member or controllable stage S.

Experiments in practice with an automatically controlled amplifier having a time constant for the controlled stage S of $t_1$ = 20 ms and a control voltage generator R according to the present invention having a time constant $t_2$ = 100 ms for low input voltages $E_i$ produced, a stabilization in approximately 150 ms when $E_i$ suddenly increased by a factor of 2; a stabilization in approximately 140 ms when $E_i$ suddenly increased by a factor of 10 and a stabilization in approximately 120 ms when $E_i$ suddenly increased by a factor 100, all without the amplifier being blocked.

Figure 2:
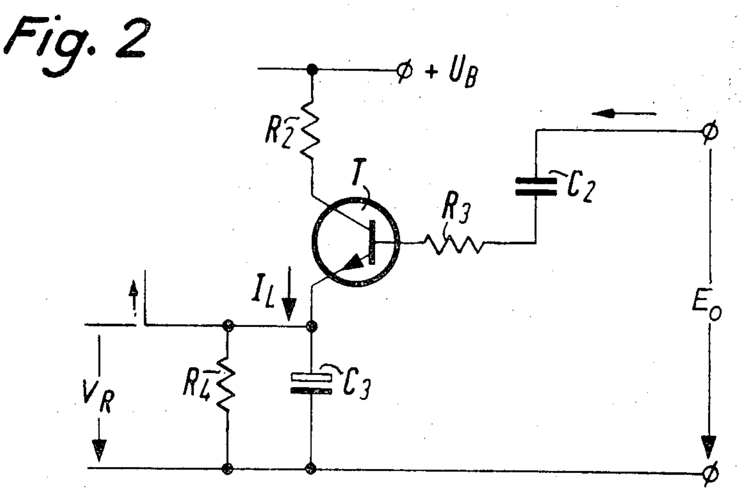
FIG. 2 is a schematic diagram of a control voltage generator for the AVC circuit according to the preferred embodiment of the invention.

FIG. 2 shows an example for the circuitry for a control voltage generator R according to the present invention which differs by the provision of resistor $R_2$ in collector current path of the transistor 7 from the conventional design of a collector detector circuit.

With this circuit, the alternating voltage $E_o$ is fed to the base of the transistor T via a capacitor $C_2$ and a resistor $R_3$ connected in series. During the positive half-cycle of signal $E_o$ the charging current $I_L$ flows from the source of operating voltage $V_B$ via the collector-emitter circuit path of transistor T into the charging capacitor $C_3$ connected to the emitter of the transistor T and there generates the control voltage $V_R$. For the sake of completeness the discharge resistor $R_4$ for capacitor $C_3$ is also shown. This resistor $R_4$ is generally of such a size that it need not be considered in determining the charging time constant of the capacitor $C_3$. In the conventional design of a collector detector, (i.e., $R_2$ is short-circuited) the maximum charge current $I_L$ is $$I_L \max \simeq ½ \cdot E_0/R_3 \cdot B, \quad (1)$$

where $B$ is the current amplification factor of the transistor T in common-emitter connection and the factor one-half considers that a charging current flows only during the positive half-cycle of $E_o$. The charging time constant $t_L$ of the conventional circuit is $$t_L = (E_0/I_L \max) \cdot C_3 \simeq (2/B) \cdot R_3C_3 \quad (2)$$

According to the present invention, the dependence of the charging time constant $t_2$ on the amplitude of the alternating voltage $E_o$ is achieved by connecting an ohmic resistor $R_2$ between the collector of the transistor T and the battery voltage source $V_B$. The charging current $I_L$ is thus limited to $$I_L' \cong ½ \,.\, (V_B/R_2) \quad (3)$$

and this results in the charging time constant $$t_L' = (E_o)/(I_L') \cdot C_3 \cong 2 \,.\, (E_o/V_B) \cdot R_2C_3. \quad (4)$$

As can be seen from Equations 1 and 3, the charging time constant $t_2$ of the control voltage generator R is $$t_2 = t_L$$

as long as the alternating voltage amplitude of the amplifier output signal is $$E_o \leq V_B \cdot (R_3)/(B \cdot R_2) \quad (5)$$

If the amplitude exceeds this value, then according to the invention $$t_2 = t_L' \cong 2 \cdot (E_o/V_B) \cdot R_2C_3 \quad (6)$$

and is thus proportional to the increased amplitude of the alternating voltage $E_o$.

In Equation 6 the components may have, for example, the following values:

$C_2 = 1\mu F$
$C_3 = 250\mu F$
$R_2$ = 15 KOhm
$R_4$ = 2 KOhm
$V_B$ = + 12 V

It will be understood that the above description of the present invention is susceptible to various modifications, changes and adaptations, and the same are intended to be comprehended within the meaning and range of equivalents of the appended claims.

I claim:

1. In an amplifier for alternating voltages which amplifier is provided with an automatic volume control (AVC) circuit responsive to the output signal thereof, and wherein the time constant of the stage or stages of the amplifier which is controlled by the AVC voltage is sufficiently large relative to the normal time constant of the AVC circuit so that temporary blocking of the amplifier would normally occur upon the occurrence of a sudden large increase in the amplifier input voltage, the improvement wherein said AVC circuit comprises: a collector-detector circuit including a transistor which is arranged only in the AVC-voltage signal path but not in the forward signal transmission path of said amplifier, said transistor having its base connected to the output of said amplifier and its emitter-collector circuit connected across a source of operating d.c. potential; a charging capacitor connected in the emitter circuit path of said transistor for furnishing the AVC circuit control voltage; and means for limiting the charging current to said capacitor comprising an ohmic resistor connected in the collector circuit path of said transistor, whereby the time constant of said AVC circuit is increased proportionally to the increase in the output voltage signal of said amplifier above a predetermined value so that with increasing input voltage to said amplifier the time constant of the AVC circuit increases to such an extent that, independent of the alternating input signal to said amplifier, overcontrol of said amplifier, and thus blocking of said amplifier, is avoided.

2. The amplifier defined in claim 1 wherein said base of said transistor is connected to the output of said amplifier via an RC series circuit.

* * * * *